United States Patent [19]

Wu

[11] Patent Number: 5,346,833
[45] Date of Patent: Sep. 13, 1994

[54] SIMPLIFIED METHOD OF MAKING ACTIVE MATRIX LIQUID CRYSTAL DISPLAY

[75] Inventor: Biing-Seng Wu, Hsin-Chu, Taiwan

[73] Assignee: Industrial Technology Research Institute, Hsinchu, Taiwan

[21] Appl. No.: 43,669

[22] Filed: Apr. 5, 1993

[51] Int. Cl.$^5$ .............................................. H01L 31/18
[52] U.S. Cl. ........................................ 437/4; 437/181; 148/DIG. 1
[58] Field of Search ....................... 437/4, 46, 181, 21; 257/60, 61; 359/59; 148/DIG. 1

[56] References Cited

U.S. PATENT DOCUMENTS

| | | | |
|---|---|---|---|
| 4,843,438 | 6/1989 | Koden et al. | 257/60 |
| 4,933,296 | 6/1990 | Parks et al. | 437/181 |
| 4,990,981 | 5/1991 | Tanaka et al. | 257/60 |
| 5,032,536 | 7/1991 | Oritsuki et al. | 437/181 |
| 5,148,248 | 9/1992 | Possin | 359/59 |

OTHER PUBLICATIONS

Lebosq et al., "An Improved Design of Active Matrix LCD Requiring only Two Photolithographic Steps" 1985 Int. Display Research Conf. pp. 34–36.

Primary Examiner—Tom Thomas
Attorney, Agent, or Firm—H. C. Lin

[57] ABSTRACT

An inverted staggered (bottom gate) thin film transistor (TFT) for active matrix liquid crystal display is processed with three masks. The first mask is used to pattern a metal film on a glass substrate as the gate of the TFT, the scan line of the TFT array, and a portion of the data line of the TFT array. The second mask is used to form a TFT mesa with a gate dielectric layer, an a-Si layer as channel, and a heavily-doped n+s-Si layer for contacting the source and the drain of the TFT. A third mask is used to pattern the transparent conductive indium-tin oxide film as the pixel electrode, the source/drain electrodes of the TFT, and the interconnections of the data line.

7 Claims, 3 Drawing Sheets

SIMPLIFIED METHOD OF MAKING ACTIVE MATRIX LIQUID CRYSTAL DISPLAY

BACKGROUND

This invention is related to active matrix liquid crystal display systems.

In conventional amorphous silicon thin film transistor liquid crystal displays (TFTLCD), the fabrication of the active matrix requires at least six to nine masking steps. For a such large number of masking steps, the production yield is low and the cost is high.

F. Morin et al suggested a low cost manufacturing method for the TFTLCD. Two masks were used for fabricating the TFT array. The method was published in the paper, "An Improved Design of Active Matrix LCD Requiring Only Two photolithographic Steps", at the 1985 International Display Research Conference, p. 34. F. Maurie et al further improved the method, as disclosed in U.S. Pat. No. 4,783,147, "Active Matrix Display Screen Without Spurious Transistor".

These two kinds of TFT have a top-gate transistor structure. H. C. Huan published a paper in the IEEE Electron Device Letters, "Dual-Gate a-Si:H Thin Film Transistors" vol EDL-3, no. 12, p. 357, proving that the top-gate a:Si:H TFT is inferior to bottom gate TFT in characteristics. The shortcomings are as follows:

1. The gate dielectric layer of silicon nitride, a-SiN, is deposited after the deposition of the semiconductor layer of amorphous silicon a-Si, the mobility of the TFT thus constructed is lower than that for the inverted staggered a-si TFT with the gate placed at the bottom of the structure.

2. When the semiconductor layer is directly in contact with the glass substrate, the semiconductor-glass interface adversely affects the characteristic of the TFT. The characteristic of the TFT with a top gate is unstable.

When the top-gate TFT is used for TFTLCD, there are further drawbacks:

1. As shown in FIG. 1, the gate electrode and the black matrix (for shielding light) are both placed above the semiconductor layer. Light from the substrate side is directly incident on the semiconductor layer, thus increasing the leakage current due to photoelectric effect.

2. The data line and the picture element (pixel) are of the same transparent conductive indium-tin-oxide(ITO) layer. If the distance between them is small (for decreasing the pixel area), it is very easy to cause a short circuit or a bridge, and produce a point defect. The problem is particularly serious for manufacturing large area TFTLCDs. The resolution of the aligner for exposing TFTLCDs decreases as the exposed area is enlarged, thus increasing the likehood of the bridge effect.

3. When ITC is used as data lines, the data line resistivity is excessive. This large resistivity limits the size of the LCD panel, because a large RC time constant slows down the frequency response, which, in turn, degrades the grey scale of the display.

SUMMARY

An object of the present invention is to eliminate the shortcomings of top-gate TFT structure. Another object of this invention is to minimize the masking steps to fabricate a bottom gate TFT. Still another object of this invention is to use a low resistivity data line. A further object of this invention is to minimize the bridging effect of closely spaced data lines.

These objects are achieved in the present invention. In a three-mask process, the first mask is used to pattern a metal gate on a glass substrate. The second mask is used to form a TFT mesa with a gate insulating layer, an a-Si layer and a heavily doped n+a-Si layer. A third mask is used to etch out the n+a-Si between the source and the drain of the TFT and pattern the interconnections (such as the data line) in the transparent conductive ITO deposited after the mesas have been formed.

In a two-mask process, the second masking step for forming the TFT mesa makes use the bottom gate as a mask, thus eliminating a separate mask.

DETAINED DESCRIPTION OF THE PREFERRED EMBODIMENT

The embodiment of this invention is a 3-mask process. The first mask is used to pattern a metal gate on a glass substrate. The second mask is used to isolate a TFT mesa with successive layers of gate dielectric, a-Si serving as channel, and heavily-doped a-Si serving as source and drain contacts. The third mask is used to remove the heavily-doped a-Si between the source and the drain and to pattern the ITC interconnections deposited after the mesa formation. The structure and the fabrication method of this 3-mask process are as follows:

(a) Deposit a metal film on a glass substrate.

Figure 1A:
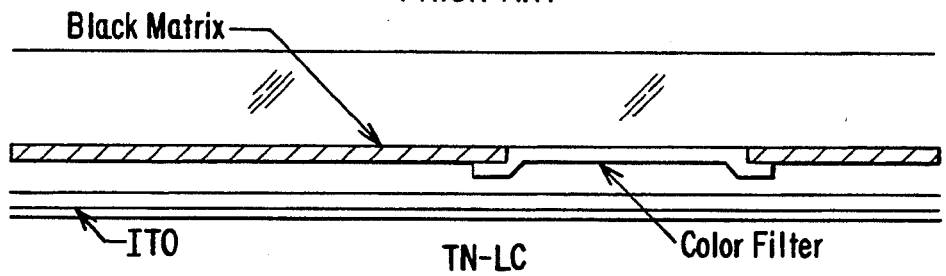
FIGS. 1a–b shows a top-gate TFT structure of prior art.
Figure 1B:
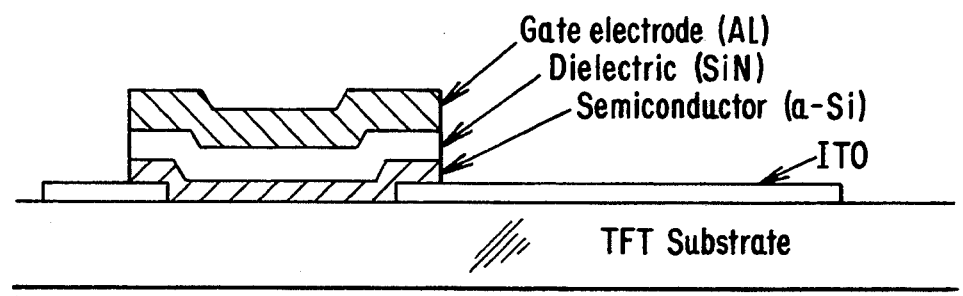
Figure 2A:
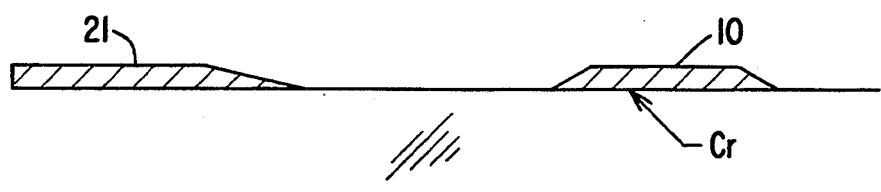
FIGS. 2a–c, 3, 4 and 5 show the processing steps of a three-mask TFT based on the preferred embodiment of the present invention.
Figure 3:
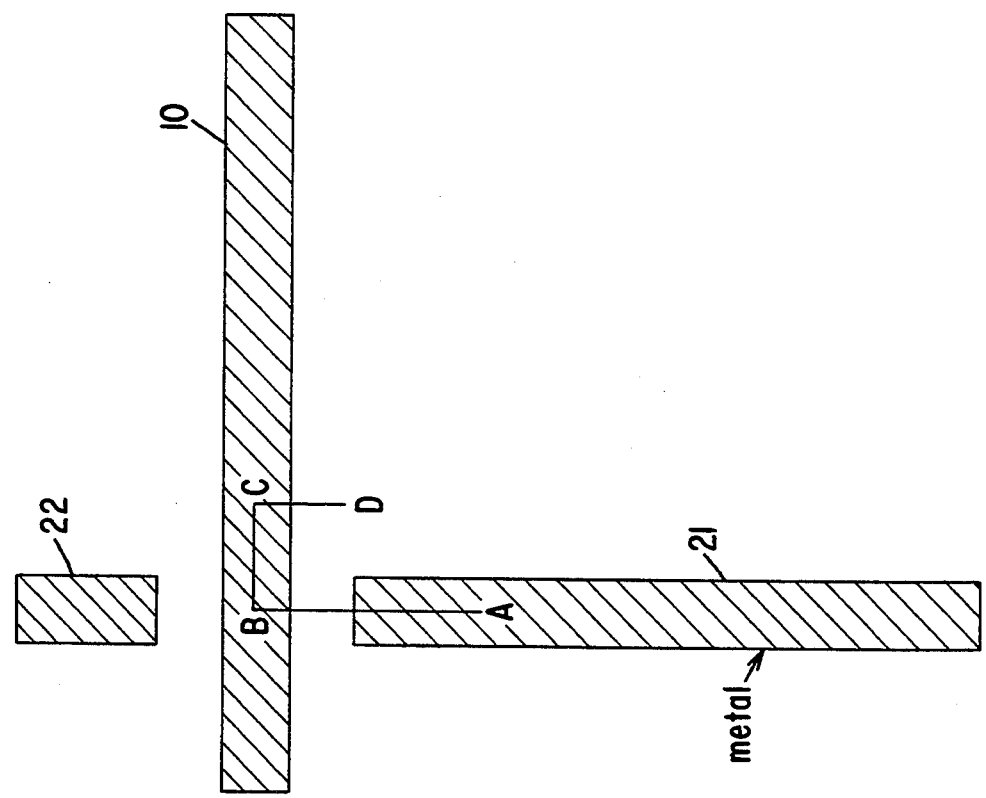

(b) Using conventional photolithographic method, pattern the gate electrode of a TFT, the scan line and portions of the data line. The top view is shown in FIG. 3, and the cross-section view along A-B-C-D in FIG. 3 is shown in FIG. 2(a).

(c) Deposit an amorphous silicon nitride (a-SiN) layer, an amorphous silicon (a-Si) layer, and a heavily-doped amorphous silicon (n+a-Si) layer in succession.

Figure 2B:
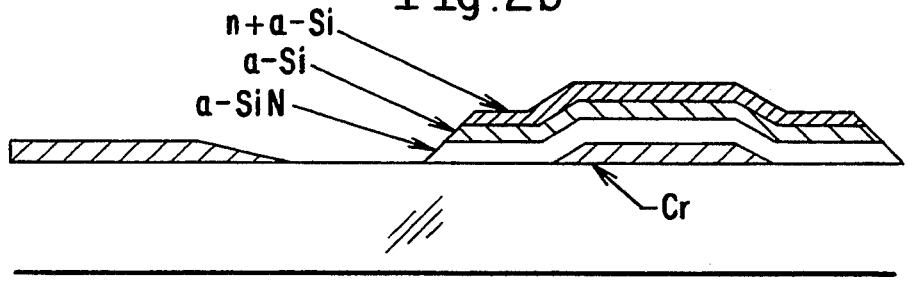

(d) Using conventional photographic method, etch out a TFT mesa. The patterned TFT region is shown in FIG. 2(b), and the top view is shown in FIG. (4).

(e) Deposit a layer of transparent indium-tin oxide (ITO).

Figure 5:
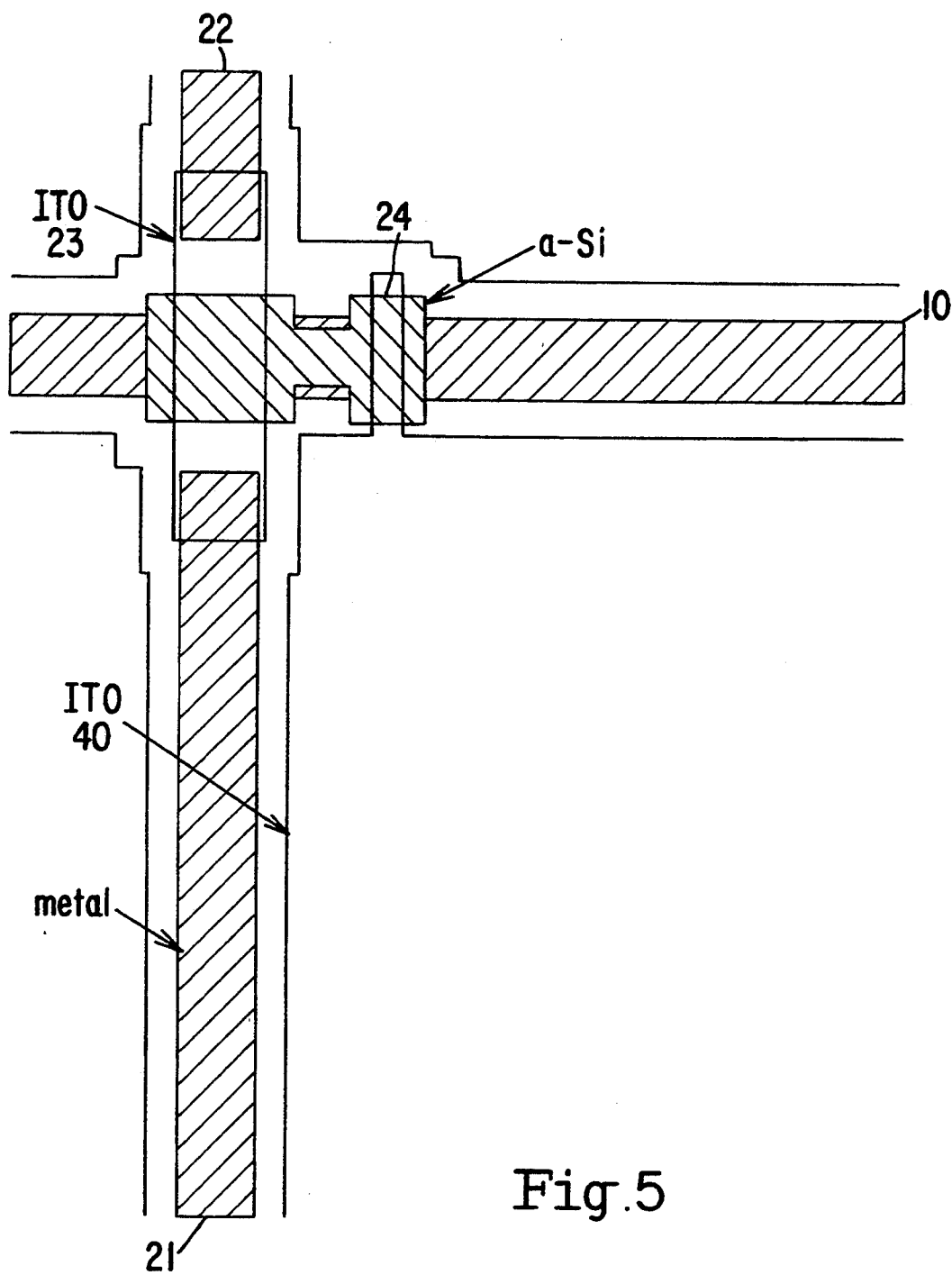

(f) Using conventional photolithographic method, pattern the pixel electrode, the interconnection of data line, and the source and drain electrodes of the TFT. The top view is shown in FIG. 5.

Figure 2C:
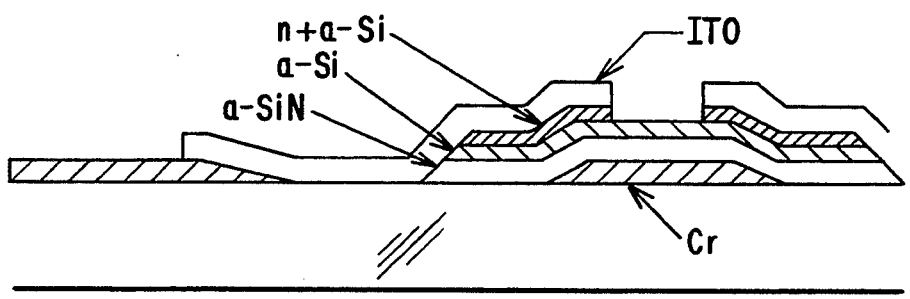
Figure 4:
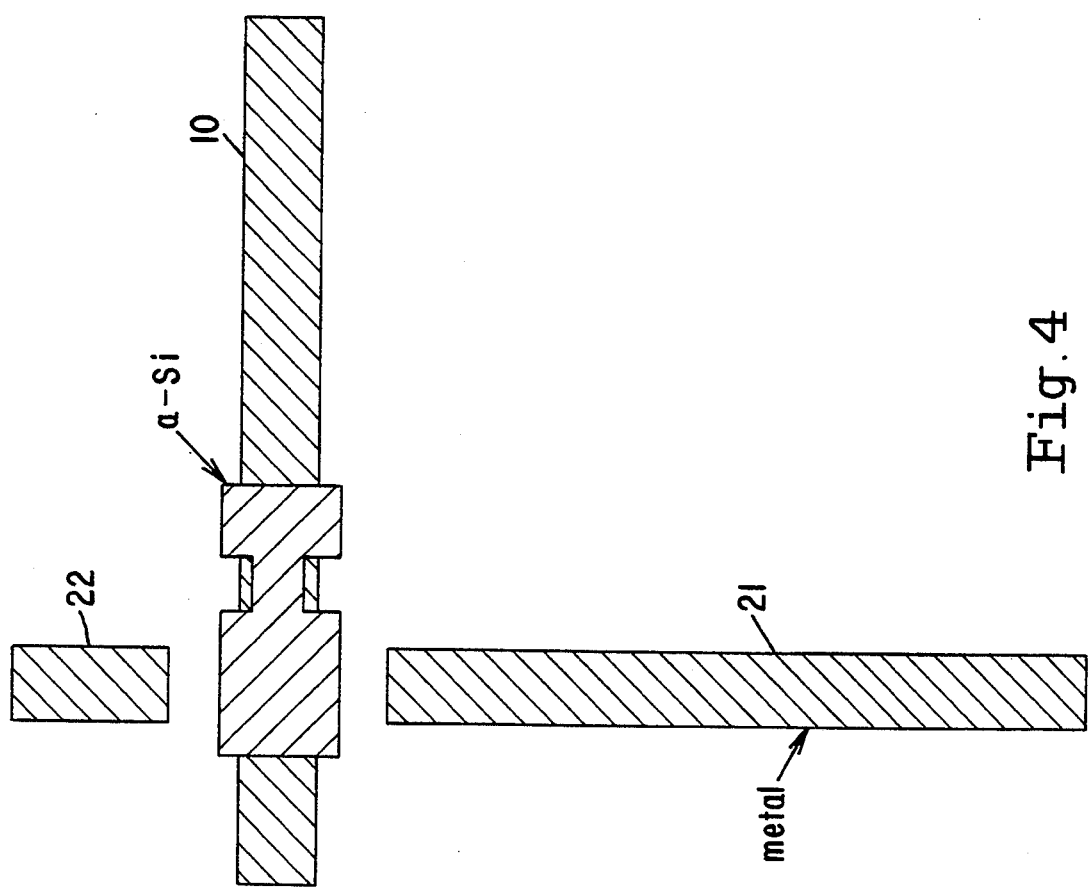

(g) Etch out the n+a-Si layer between the source and the drain. The cross-sectional view is shown in FIG. 2(c).

The foregoing method requires only three masks as indicated in steps (b), (d) and (f).

What is claimed is:

1. A three mask method of fabricating an inverted staggered thin film transistor of an inverted staggered structure for active matrix crystal display systems with a matrix of picture elements, each thin film transistor having a gate, a source, and a drain, comprising the steps of:

depositing a metal film on a transparent substrate;

patterning said metal film as said gate electrode of said thin film transistor, as scan lines, and as data lines using a first mask;

successively depositing an insulating layer, an amorphous semiconductor layer, and a heavily doped amorphous semiconductor layer over said transparent substrate;

simultaneously patterning said insulating layer, said amorphous semiconductor layer, and said heavily doped amorphous semiconductor layer using a second mask to form a mesa;

depositing a transparent conducting layer over said mesa; and patterning said transparent conducting layer using a third mask to form electrodes of picture elements, and crossover connections of said data lines at cross-points with said scan lines.

2. A three-mask method of making a thin film transistor as described in claim 1, wherein said substrate is glass.

3. A three-mask method of making a thin film transistor as described in claim 1, wherein said metal is selected from a group consisting of chromium and aluminum.

4. A three-mask method of making a thin film transistor as described in claim 1, wherein said insulating layer is silicon-nitride.

5. A three-mask method of making a thin film transistor as described in claim 1, wherein said amorphous semiconductor is amorphous silicon.

6. A three-mask method of making a thin film transistor as described in claim 1, wherein said heavily doped semiconductor is heavily doped silicon.

7. A three-mask method of making a thin film transistor as described in claim 1, wherein said transparent conductive layer is tin-indium-oxide.

* * * * *

UNITED STATES PATENT AND TRADEMARK OFFICE
CERTIFICATE OF CORRECTION

PATENT NO.    : 5,346,833
DATED         : September 13, 1994
INVENTOR(S)   : Biing-Seng Wu It is certified that error appears in the above-identified patent and that said Letters Patent is hereby corrected as shown below:

<u>Title page,</u>
Item [21], patent application number "43,669" should read -- 08/043,669 --.

Signed and Sealed this

Twenty-fourth Day of December, 2002

JAMES E. ROGAN
*Director of the United States Patent and Trademark Office*